United States Patent [19]

Takeshita et al.

[11] Patent Number: 5,049,452

[45] Date of Patent: Sep. 17, 1991

[54] TARGET MEMBER USED FOR FORMATION OF SUPERCONDUCTING FILM

[75] Inventors: Takuo Takeshita; Tadashi Sugihara, both of Saitama, Japan

[73] Assignee: Mitsubishi Metal Corporation, Tokyo, Japan

[21] Appl. No.: 399,553

[22] PCT Filed: Dec. 8, 1988

[86] PCT No.: PCT/JP88/01238

§ 371 Date: Aug. 9, 1989

§ 102(e) Date: Aug. 9, 1989

[87] PCT Pub. No.: WO89/05283

PCT Pub. Date: Jun. 15, 1989

[30] Foreign Application Priority Data

Dec. 9, 1987 [JP] Japan .................... 62-311695

[51] Int. Cl.$^5$ .............................. C22C 32/00
[52] U.S. Cl. ..................... 428/614; 75/232; 75/234; 505/1; 505/700; 505/731; 505/785
[58] Field of Search ............... 428/614; 505/731, 785, 505/1, 700; 75/232, 234

[56] References Cited

FOREIGN PATENT DOCUMENTS 63-241823 10/1988 Japan .
63-255367 10/1988 Japan .
64-004466 1/1989 Japan .
64-14821 1/1989 Japan .................... 505/731
1-203219 8/1989 Japan .

OTHER PUBLICATIONS

Ohkuma et al., "Preparation of Y–Ba–Cu–O Thin Films by Rf-Magnetron Sputtering" Jap. J. Appl. Phys. vol. 26, No. 9, Sep., 1987, pp. L1484–L1486.

Goyal et al. "Cermets of the $Y_1Ba_2Cu_3O_{7-\delta}$ Superconductors" Materials Letters, vol. 6, No. 8.9, May 1988, pp. 257–260.

Komuro et al., "Structure and Superconducting Properties of Y–Ba–Cu–O Sputtered Films", Jap. J. of Appl. Phys., vol. 26, No. 11, Nov. 1987, pp. L1907–L1909.

Primary Examiner—R. Dean
Assistant Examiner—David Schumaker
Attorney, Agent, or Firm—Sughrue, Mion, Zinn, Macpeak & Seas

[57] ABSTRACT

A target according to the present invention contains metallic copper ranging from about 8% to about 40% by volume and an oxide containing a rare earth metal such as yttrium and an alkaline earth metal, and has a metallic structure where the oxide is substantially uniformly dispersed into the metallic copper, so that a large thermal conductivity, great mechanical strength and a low electric resistivity are achieved.

5 Claims, No Drawings

TARGET MEMBER USED FOR FORMATION OF SUPERCONDUCTING FILM

TECHNICAL FIELD

This invention relates to a target member used for formation of a superconducting film on a surface of a substrate by using, for example, a sputtering technique, and, more particularly, to a target member having a high cooling efficiency and a low resistivity and further superior in mechanical strength.

BACKGROUND ART

Recently, many attempts are made for forming a film of a superconducting ceramic material mainly composed of an oxide containing a rare earth metal such as, for example, yttrium an alkaline earth metal and copper (which is hereinbelow referred to as "oxide in the R-A-Cu-O system") on a surface of a substrate. One of these attempts is to form a superconducting ceramic in the R-A-Cu-0 system by sputtering a target, and description is made for a fabrication process of the target used in the sputtering process.

Conventionally, the fabrication process of the target used for formation of a superconducting film starts with preparing a powder of an oxide containing a rare earth metal such as, for example, yttrium, a powder of an alkaline earth metal carbonate and a powder of a copper oxide, and these ingredient powders are 10 microns in average diameter of the component particles. Those powders are mixed into a predetermined proportion to form a mixture, and the mixture is calcined in an oxidation ambient at 850 degrees to 950 degrees in centigrade, the calcined product is, then, pulverized, and the calcining and the pulverizing are repeated twice or more, if necessary, so as to produce a powder of a superconducting ceramic material in the R-A-Cu-0 system The powder of the superconducting ceramic material is shaped by using a hot pressing technique. Namely, the powder of the superconducting ceramic material is heated in a vacuum ambient at 800 degrees to 900 degrees in centigrade and pressed at 100 kgf/cm$^2$ to 200 kgf/cm$^2$ for 1 to 4 hours. The target is fabricated in this manner.

The target thus fabricated is mainly formed of a superconducting ceramic material in the R-A-Cu-0 system or of a substance like the ceramic in the R-A-Cu-0 system containing the copper oxide (which is hereinbelow represented by CuO) equal to or less than 20% by volume.

However, the composition of the target may be transferred to the composition of the thin film depending upon the sputtering system and the sputtering conditions, and the target is liable to be causative of shortage of CuO. For this reason, the powder of the superconductor used in the formation of the prior art target contains excessive CuO equal to or less than 20% by volume.

However, the prior art target exhibits low in thermal conductivity, and, accordingly, is low in cooling efficiency. For this reason, a large difference in temperature exists between the sputtered front surface and the cooled back surface of the target, and a problem is encountered in the target in production of cracks due to the thermal stress. Moreover, the prior art target is so large in electric resistivity that an inexpensive DC diode sputtering system can not be used, and, for this reason, an expensive RF sputtering system is usually required This results in another problem in a large amount of production cost for the production of the superconducting thin film. Furthermore, the prior art target exhibits low mechanical strength and brittleness, so in careful handling is required.

It is therefore an object of the present invention to provide a target which is free from the problems inherent in the prior art target.

DISCLOSURE OF INVENTION

Research and development efforts have been made by the inventors for providing a solution of the problems inherent in the prior art target used for the formation of the superconducting film. The inventors discovers that a target solves the aforementioned problems when the target is produced by mixing a powder of metallic copper ranging between about 8% and about 40% by volume with an oxide in the R-A-Cu-O system or an oxide containing a rare earth metal and an alkaline earth metal or metals, (this oxide is hereinbelow referred to as "oxide in the R-A-O system" and is supplemented with copper at a latter stage), further mixing CuO therewith, if necessary, then hot pressing in, for example, a vacuum ambient at 400 degrees to 900 degrees in centigrade under the pressure of 100 kgf/cm$^2$ to 200 kgf/cm$^2$. The target thus produced has a metallic structure where the oxide in either R-A-O or R-A-Cu-O system or both oxides are uniformly dispersed into the metallic copper together with CuO contained therein, if necessary. The target with such a metallic structure is larger in the thermal conductivity than the metallic copper, and, for this reason, the cooling efficiency is drastically improved. Moreover, the metallic copper is causative of reduction in the electric resistivity of the target as well as in enhancement of the mechanical strength, imparting tenacity thereto.

The present invention is made on the basis of the above mentioned discovery, and a target used for formation of a superconducting film according to the present invention contains metallic copper ranging from about 8% to about 40% by volume and either of or both of an oxide in the R-A-O system and another oxide in the R-A-Cu-O system and has a structure where the oxide or oxides are substantially uniformly dispersed throughout in the metallic copper.

The target may further contain CuO not greater than about 20% by volume. The oxide or oxides may contain a plurality of alkaline earth metals In the target according to the present invention, the reason why the metallic copper content is equal to or greater than about 8% by volume is that the metallic copper content less than about 8% by volume can not achieve a sufficiently large thermal conductivity, a low resistivity applicable for the DC diode sputtering system and a mechanical strength allowing for handling with usual care. On the other hand, if the content exceeds about 40% by volume, the relative copper content is too large to form a superconducting film with a nominal composition of, for example, YBa$_2$Cu$_3$O$_{7-x}$ by using sputtering due to the necessity of restricting copper oxide content to a level not greater than about 20% by volume.

BEST MODE FOR CARRYING OUT THE INVENTION

Description is hereinbelow made for a process of fabricating a target embodying the present invention as well as for the properties of various examples. The fabrication process starts with preparing ingredient powders of oxides in the R-A-O system, oxides of the R-A-Cu-O system and copper the compositions of which are shown in Table 1-1, and the average diameters thereof are equal to or less than 5 microns. In Table 1-1, R is representative of one of the rare earth metals including yttrium, A is indicative of an alkaline earth metal, O stands for oxygen, and CuO is mixed with the oxide in the R-A-Cu system or the oxide in the R-A-Cu-O system, if necessary. Those ingredient powders are mixed into respective proportions indicated in Table 1-1, and, accordingly, mixtures are formed. The mixtures are respectively shaped by using a hot pressing technique, then targets are completed. The hot pressing is carried out in a vacuum ambient of about $10^{-3}$ torr at about 800 degrees in centigrade, and the mixtures are pressed under a pressure of about 150 kgf/cm$^2$ for about 3 hours. Then, targets are produced with respective composition substantially identical with the mixing proportion shown in Table 1-1, and the targets respectively have metallic structures where the aforementioned oxides or the mixtures of the oxides and CuO are substantially uniformly dispersed into the copper, respectively, each measuring about 50 millimeters in diameter and about 4 millimeters in thickness. The specimens according to the present invention are labeled with reference numbers 1 to 18.

The prior art target are produced for comparison purpose. The prior art targets are produced by using oxides in the R-A-Cu-O system, oxides in the R-A-O system and CuO selectively mixed with some of these oxides if necessary, however, no metallic copper powder is contained therein, the compositions of the oxides being shown in Table 2-1. Moreover, in order to prove the effectiveness of the copper content range, targets for reference are also produced. The prior art targets are produced through a fabrication process similar to that of the present invention with the exception that the temperature is increased to 850 degrees in centigrade during the hot pressing, the targets for reference are respectively labeled with reference numbers 21 to 24, and the prior targets are labeled with reference numbers 25 to 38, respectively.

Subsequently, the targets of the present invention, the targets for reference and the prior art targets thus produced are evaluated in properties. All of the targets are measured in thermal conductivity as well as electric resistivity for evaluating cooling efficiency, flexural strength, mechanical strength.

Then, the targets are respectively installed in a DC magnetron sputtering system (or alternatively in a RF magnetron sputtering system), and are sputtered in the following conditions.

Total pressure of ambient: $10^{-4}$ to $10^{-1}$ torr

Ambient: Argon or a gaseous mixture of argon and oxygen ranging from 5% to 50%.

Supplied electric power: 100 watts to 600 watts.

Substrates used: Single-crystalline magnesium oxide with the surface measuring 100 millimeters.

Distances between the substrates and the targets: 50 centimeters to 130 centimeters.

Thicknesses of the thin films: 2 microns.

The thin films thus deposited on the substrates are subjected to a heat treatment. The heat treatment is carried out in an oxidation ambient at about 910 degrees in centigrade for about an hour followed by a furnace cooling. Critical temperatures (Tc) are measured for the respective thin films by using the four probe method. The results of those measurements are shown in Tables 1-2 and 2-2.

As will be understood from Tables 1-2 and 2-2, the targets according to the present invention 1 to 18 are much higher in thermal conductivity than the prior art targets 25 to 38, (therefore, higher in the cooling efficiency in the sputtering), exhibit higher flexural strength (or mechanical strength), and the resistivities are lower than the prior art specimens. Moreover, the superconducting thin films deposited by sputtering the targets of the present invention are on an equal level in other properties, such as the critical temperature, with the thin films deposited by sputtering the prior art targets.

As described hereinbefore, the target according to the present invention has no problem in the composition for formation of the superconducting thin film, and is so superior in the cooling efficiency that no crack due to thermal stress takes place in a high speed sputtering process. Since the resistivity is extremely low, the thin film is deposited by using not only the RF sputtering system but also the DC diode sputtering system, and the mechanical strength is large enough to easily handle in manufacturing.

On the other hand, the targets for reference 22 and 24 are smaller in copper content than the range characterizing the present invention, and, for this reason, those properties are not improved. Since the targets 21 and 23 are larger in the copper content than the range characterizing the present invention, the critical temperatures Tc are deteriorated.

TABLE 1-1

| | Mixing Proportion | | | | | |
|---|---|---|---|---|---|---|
| | Composition of Oxide in R—A—Cu—O or R—A—O System | | | | Volume | |
| Specimen | (by weight) | | | | % | |
| | R | A | Cu | O | CuO | Cu |
| TARGETS OF THE PRESENT INVENTION | | | | | | |
| 1 | Y:13.5 | Ba:41.7 | 28.9 | residual | residual | — | 40 |
| 2 | Y:12.7 | Ba:39.1 | 32.1 | residual | residual | 6.3 | 25 |
| 3 | Y:11.9 | Ba:36.8 | 36.0 | residual | residual | 12.4 | 15 |
| 4 | Y:11.1 | Ba:34.4 | 37.9 | residual | residual | 17.6 | 8 |
| 5 | Er:22.2 | Ba:37.3 | 25.9 | residual | residual | — | 20 |
| 6 | Dy:21.7 | Ba:36.7 | 27.3 | residual | residual | 2.5 | 13 |
| 7 | Yb:20.8 | Ba:33.6 | 30.9 | residual | residual | 10.5 | 30 |
| 8 | Gd:21.6 | Ba:37.8 | 26.2 | residual | residual | — | 9 |
| 9 | Tm:31.1 | Ba:38.0 | 17.6 | residual | residual | — | 17 |
| 10 | Nd:30.4 | Ba:57.8 | — | residual | residual | — | 21 |
| 11 | Lu:21.8 | Ba:34.2 | 29.6 | residual | residual | 8.2 | 28 |
| 12 | Sm:15.8 | Ba:43.2 | 26.7 | residual | residual | — | 9 |
| 13 | Y:14.5 | Ba:22.3 Sr:14.2 | 31.8 | residual | residual | 1.0 | 11 |
| 14 | Eu:21.4 | Ba:36.7 Ca:0.6 | 26.8 | residual | residual | — | 35 |
| 15 | Y:33.4 Y:15.8 | Ba:51.6 Ba:71.9 | — — | residual | 39.1 residual | — | 37 |
| 16 | Y:21.2 Y:13.5 | Ba:65.5 Ba:41.7 | — 28.9 | residual | 28.1 residual | — | 18 |
| 17 | Y:12.7 Y:11.9 | Ba:39.1 Ba:36.8 | 32.1 35.0 | residual | 39.1 residual | 3.0 | 10 |
| 18 | Y:21.2 Y:11.9 | Ba:65.5 Ba:34.4 | — 37.9 | residual | 43.0 residual | 7.0 | 15 |

TABLE 1-2

| | Thermal Conductivity (cal/cm. sec. deg. in C.) | Resistivity (ohm · cm) | Flexural Strength (kg/cm$^2$) | Critical Temperature (deg in K.) |
|---|---|---|---|---|
| Specimen | | | | |
| TARGETS OF THE PRESENT INVENTION | | | | |
| 1 | 0.39 | $2 \times 10^{-6}$ | 150 | 62 |

TABLE 1-2-continued

| Specimen | Thermal Conductivity (cal/cm. sec. deg. in C.) | Resistivity (ohm · cm) | Flexural Strength (kg/cm²) | Critical Temperature (deg in K.) |
|---|---|---|---|---|
| 2 | 0.26 | $3 \times 10^{-6}$ | 140 | 77 |
| 3 | 0.17 | $6 \times 10^{-6}$ | 130 | 85 |
| 4 | 0.08 | $21 \times 10^{-6}$ | 130 | 86 |
| 5 | 0.21 | $4 \times 10^{-6}$ | 160 | 89 |
| 6 | 0.14 | $7 \times 10^{-6}$ | 150 | 87 |
| 7 | 0.30 | $3 \times 10^{-6}$ | 190 | 67 |
| 8 | 0.08 | $18 \times 10^{-6}$ | 130 | 88 |
| 9 | 0.18 | $5 \times 10^{-6}$ | 160 | 73 |
| 10 | 0.20 | $4 \times 10^{-6}$ | 150 | 69 |
| 11 | 0.30 | $3 \times 10^{-6}$ | 100 | 64 |
| 12 | 0.09 | $20 \times 10^{-6}$ | 160 | 72 |
| 13 | 0.10 | $10 \times 10^{-6}$ | 230 | 68 |
| 14 | 0.36 | $2 \times 10^{-6}$ | 160 | 76 |
| 15 | 0.37 | $2 \times 10^{-6}$ | 150 | 73 |
| 16 | 0.20 | $4 \times 10^{-6}$ | 145 | 70 |
| 17 | 0.09 | $20 \times 10^{-6}$ | 165 | 72 |
| 18 | 0.19 | $5 \times 10^{-6}$ | 140 | 69 |

TABLE 2-1

Mixing Proportion

Composition of Oxide in R—A—Cu—O system or R—A—O (by weight)

| specimen | R | A | Cu | O | Volume % | CuO | Cu |
|---|---|---|---|---|---|---|---|
| REFERENCE | | | | | | | |
| 21 | Y:13.5 | Ba:41.7 | 28.9 | residual | residual | — | 43* |
| 22 | Y:11.1 | Ba:34.4 | 37.9 | residual | residual | 17.6 | 6* |
| 23 | Nd:30.4 | Ba:57.8 | — | residual | residual | — | 45* |
| 24 | Sm:15.8 | Ba:43.2 | 26.2 | residual | residual | — | 6* |
| PRIOR ART TARGETS | | | | | | | |
| 25 | Y:6.2 | Ba:19.2 | 56.4 | residual 18.2 | residual | 54.0 | — |
| 26 | Y:7.9 | Ba:24.6 | 49.8 | residual | residual | 41.1 | — |
| 27 | Y:9.0 | Ba:27.9 | 45.8 | residual | residual | 33.2 | — |
| 28 | Y:9.6 | Ba:29.8 | 43.5 | residual | residual | 28.6 | — |
| 29 | Er:16.3 | Ba:26.7 | 41.2 | residual | residual | 30.7 | — |
| 30 | Dy:17.6 | Ba:29.7 | 37.3 | residual | residual | 22.8 | — |
| 31 | Yb:12.5 | Ba:19.9 | 50.7 | residual | residual | 49.0 | — |
| 32 | Gd:18.8 | Ba:32.7 | 33.4 | residual | residual | 15.0 | — |
| 33 | Tm:22.6 | Ba:27.5 | 34.8 | residual | residual | 26.6 | — |
| 34 | Nd:20.2 | Ba:38.5 | 26.7 | residual | residual | 32.3 | — |
| 35 | Lu:13.4 | Ba:21.1 | 48.8 | residual | residual | 45.6 | — |
| 36 | Sm:13.5 | Ba:37.1 | 34.3 | residual | residual | 15.3 | — |
| 37 | Y:11.8 | Ba:18.2 Sr:11.6 | 40.3 | residual | residual | 18.7 | — |
| 38 | Eu:11.6 | Ba:19.8 Ca:0.3 | 51.2 | residual | residual | 48.9 | — |

(*out of the scope of the present invention)

TABLE 2-2

| Specimen | Thermal Conductivity (cal/cm. sec. deg. in C.) | Resistivity (ohm · cm) | Flexural Strength (kg/cm²) | Critical Temperature (deg in K.) |
|---|---|---|---|---|
| REF. | | | | |
| 21 | 0.45 | $1 \times 10^{-6}$ | 130 | 50 |
| 22 | 0.02 | $23 \times 10^{-3}$ | 70 | 68 |
| 23 | 0.43 | $1 \times 10^{-6}$ | 135 | 48 |
| 24 | 0.02 | $9 \times 10^{-3}$ | 80 | 70 |
| PRIOR ART TARGETS | | | | |
| 25 | 0.01 | $3.2 \times 10^{-3}$ | 80 | 73 |
| 26 | 0.01 | 6.3 | 90 | 76 |
| 27 | 0.01 | 2.5 | 80 | 76 |
| 28 | 0.01 | 0.43 | 80 | 78 |
| 29 | 0.01 | 0.78 | 120 | 75 |
| 30 | 0.01 | 0.21 | 100 | 65 |
| 31 | 0.01 | 50.0 | 140 | 60 |
| 32 | 0.01 | $4.2 \times 10^{-2}$ | 80 | 73 |
| 33 | 0.01 | 0.50 | 120 | 50 |
| 34 | 0.01 | 0.91 | 100 | 45 |
| 35 | 0.01 | 12.0 | 50 | 55 |
| 36 | 0.01 | $3.5 \times 10^{-2}$ | 120 | 40 |
| 37 | 0.01 | $7.6 \times 10^{-2}$ | 160 | 57 |
| 38 | 0.01 | 36.0 | 110 | 57 |

INDUSTRIAL APPLICABILITY

The targets according to the present invention is usable for depositing thin films of oxides on either substrates or insulating films.

We claim:

1. A solid target used in formation of a superconducting film, comprising: metallic copper ranging from about 8% to about 40% by volume; and at least an oxide selected from the group consisting of oxides each containing an element selected from the group consisting of the rare earth metals including yttrium and an alkaline earth metal, and oxides each containing an element selected from the group consisting of the rare earth metals including yttrium, an alkaline earth metal and copper, wherein said oxide is generally uniformly dispersed throughout said metallic copper in the metallic structure thereof.

2. A solid target used in formation of a superconducting film, comprising: metallic copper ranging from about 8% to about 40% by volume; and at least an oxide selected from the group consisting of oxides each containing an element selected from the group consisting of the rare earth metals including yttrium and an alkaline earth metal, and oxides each containing an element selected from the group consisting of the rare earth metals including yttrium, an alkaline earth metal and copper, wherein said oxide is generally uniformly dispersed throughout said metallic copper in the metallic structure thereof, said target further comprising a copper oxide equal to or less than about 20% by volume.

3. A solid target used in formation of a superconducting film, comprising: metallic copper ranging from about 8% to about 40% by volume; and at least an oxide selected from the group consisting of oxides each containing an element selected from the group consisting of the rare earth metals. including yttrium and an alkaline earth metal, and oxides each containing an element selected from the group consisting of the rare earth metals including yttrium, an alkaline earth metal and copper, wherein said oxide is generally uniformly dispersed throughout said metallic copper in the metallic structure thereof, said target further comprising another oxide selected from the group consisting of the oxides each containing an element selected from the group consisting of the rare earth metals including yttrium and an alkaline earth metal, and the oxides each containing an element selected from the group consisting of the rare earth metals including yttrium, an alkaline earth metal and copper.

4. A target used in formation of a quaternary superconducting film as set forth in claim 3, in which said target further comprises a copper oxide equal to or less than about 20% by volume.

5. A solid target used in formation of a superconducting film, comprising: metallic copper ranging from about 8% to about 40% by volume; and at least an oxide selected from the group consisting of oxides each containing an element selected from the group consisting of the rare earth metals including yttrium and an alkaline earth metal, wherein said oxide is generally uniformly dispersed throughout said metallic copper in the metallic structure thereof.

* * * * *